(12) United States Patent
Zhao et al.

(10) Patent No.: US 11,721,795 B2
(45) Date of Patent: Aug. 8, 2023

(54) LED MATRIX DRIVING SYSTEM

(71) Applicant: Monolithic Power Systems, Inc., San Jose, CA (US)

(72) Inventors: Junjian Zhao, San Jose, CA (US); Yu-Huei Lee, New Taipei (CN); Liwei Hou, Chengdu (CN); Zheng Luo, San Jose, CA (US); Ze-Qiang Yao, Santa Clara, CA (US); Heng Li, Chengdu (CN); Suwei Wang, Chengdu (CN); Tong Chen, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 191 days.

(21) Appl. No.: 17/205,266

(22) Filed: Mar. 18, 2021

(65) Prior Publication Data
US 2022/0302361 A1    Sep. 22, 2022

(51) Int. Cl.
| | |
|---|---|
| *H01L 33/62* | (2010.01) |
| *H01L 23/48* | (2006.01) |
| *H01L 23/498* | (2006.01) |
| *H01L 23/00* | (2006.01) |
| *H01L 25/16* | (2023.01) |

(52) U.S. Cl.
CPC ............ *H01L 33/62* (2013.01); *H01L 23/481* (2013.01); *H01L 23/49822* (2013.01); *H01L 24/16* (2013.01); *H01L 25/167* (2013.01); *H01L 2224/16227* (2013.01)

(58) Field of Classification Search
CPC . H01L 33/62; H01L 23/481; H01L 23/49822; H01L 24/16; H01L 25/167; H01L 2224/16227
See application file for complete search history.

(56) References Cited

U.S. PATENT DOCUMENTS

| | | | |
|---|---|---|---|
| 2016/0155892 A1* | 6/2016 | Li | H01L 25/0753 257/89 |
| 2020/0119243 A1* | 4/2020 | Yu | H01L 25/167 |
| 2021/0272510 A1* | 9/2021 | Huitema | H01L 25/167 |
| 2022/0036831 A1* | 2/2022 | Gray | H04B 3/54 |

* cited by examiner

*Primary Examiner* — Benjamin Tzu-Hung Liu
(74) *Attorney, Agent, or Firm* — Perkins Coie LLP (57) ABSTRACT

A LED driving system for driving a LED matrix. The LED driving system includes an interconnection structure having a first surface and a second surface opposite to the first surface and a plurality of driver dies/chips attached to the first surface of the interconnection structure. The LED matrix is divided into a plurality of sub LED matrix sections that are attached to the second surface of the interconnection structure. The interconnection structure is configured to electrically couple each one of the plurality of sub LED matrix sections to a corresponding one driver die/chip in the plurality of driver dies/chips.

19 Claims, 8 Drawing Sheets

LED MATRIX DRIVING SYSTEM

TECHNICAL FIELD

This disclosure relates generally to electronic circuits, and more particularly but not exclusively relates to assembly of LED chips matrix with driving modules.

BACKGROUND

Figure 1A:
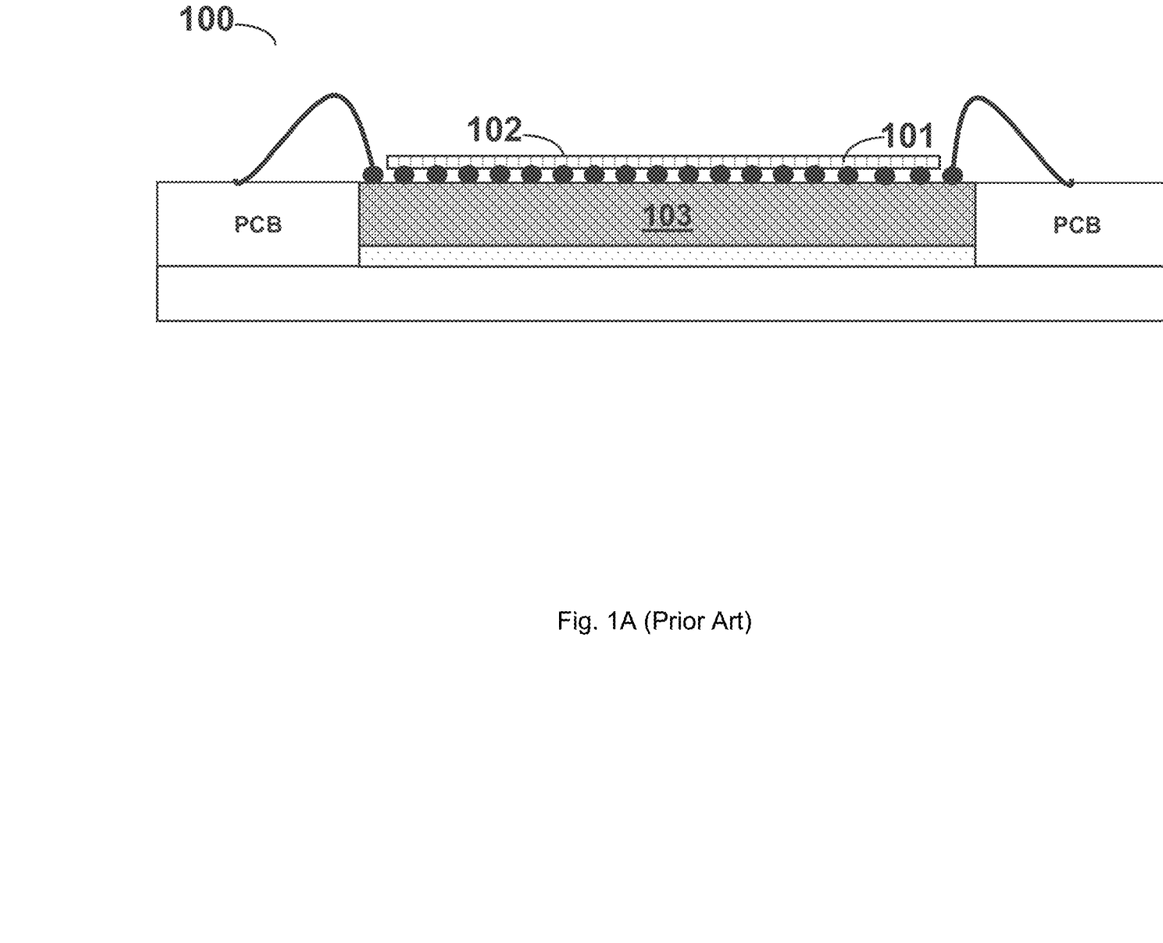
FIG. 1A illustrates a cross sectional view of a conventional LED matrix driving system 100 comprising a single large LED driver chip 103 and a LED matrix 102.
Figure 1B:
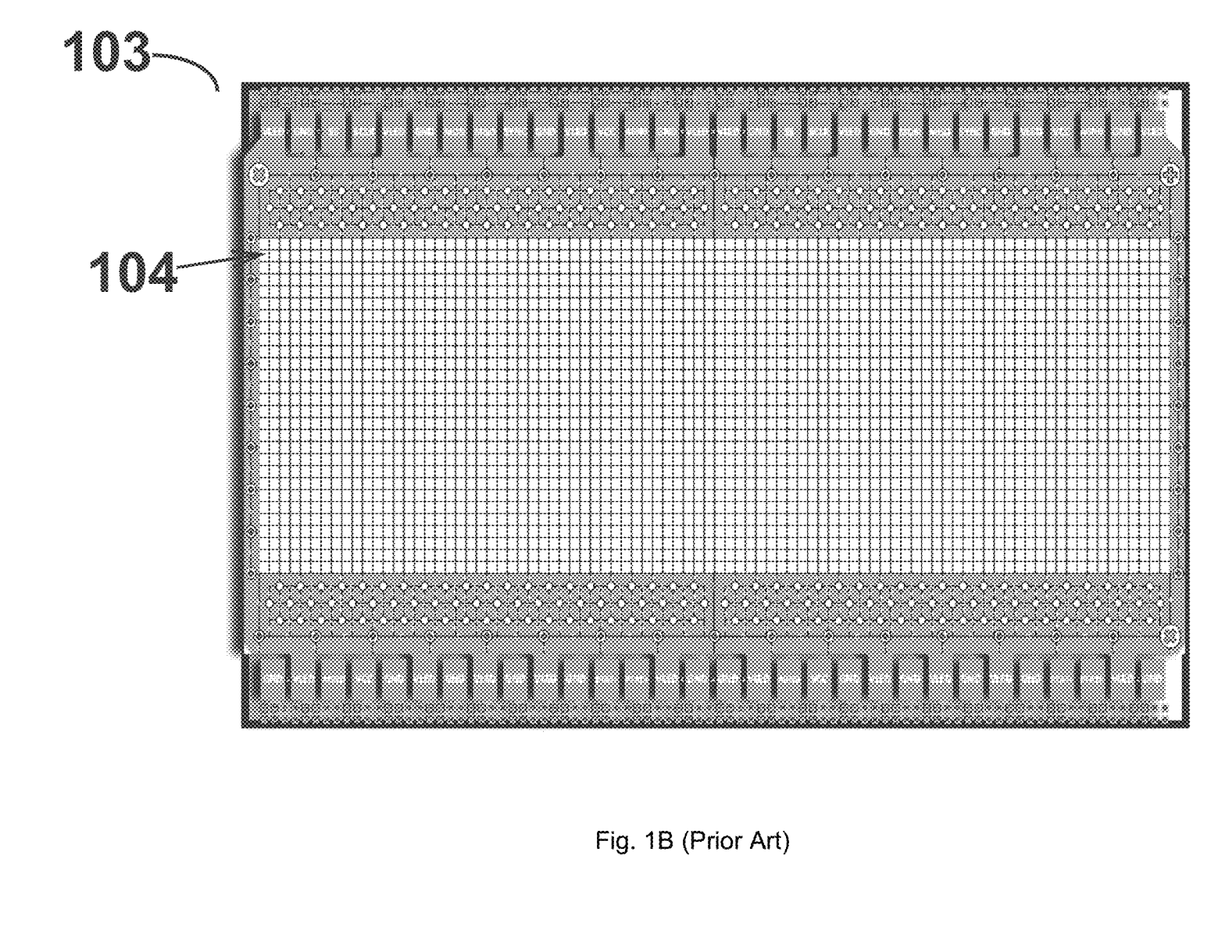
FIG. 1B illustrates a top plan view of the single large LED driver chip 103 comprising integrated driver modules 104.

Large matrix of high-brightness light emitting diodes ("LEDs") is more and more popular in applications such as highly pixilated light sources, high brightness LED matrix displays and automotive LED headlight systems etc. Conventionally, as shown in FIG. 1A and FIG. 1B, all the LED chips (LED pixels) 101 in the large matrix 102 of LEDs are attached directly to a single large LED driver chip 103 with driving circuit or driver module to each LED pixel integrated in the large LED driver chip 103. FIG. 1A illustrates a cross sectional view of the LED matrix driving system comprising the single large LED driver chip 103 and the LED matrix 102 that include the LED pixels 101. FIG. 1B illustrates a top plan view of the single large LED driver chip 103 comprising integrated driver modules 104, each driver module 104 dedicated to drive a corresponding one LED pixel. However, due to large size of the single large LED driver chip 103, warpage may occur and yield may be lower than 70%.

SUMMARY

In accomplishing the above and other objects, there has been provided, in accordance with an embodiment of the present disclosure, a LED driving system. The LED driving system comprising a LED matrix having a plurality of LED pixels, a plurality of driver dies/chips and an interconnection structure. Each one of the plurality of driver dies/chips is provided to drive a corresponding predetermined number of LED pixels in the LED matrix, and wherein the predetermined number is an integer greater than 1. The interconnection structure may comprise at least one semiconductor layer having a plurality groups of through semiconductor vias formed in the at least one semiconductor layer and at least one rewiring layer formed on the at least one semiconductor layer. The at least one semiconductor layer has a first surface used as a first surface of the interconnection structure, and the at least one rewiring layer has a surface used as a second surface of the interconnection structure. The plurality of driver dies/chips are attached to the first surface of the interconnection structure, and the plurality of LED pixels of the LED matrix are attached to the second surface of the interconnection structure, wherein the interconnection structure is configured to electrically couple each one of the plurality of driver dies/chips to the corresponding predetermined number of LED pixels in the LED matrix.

In accordance with an embodiment, a plurality of exposed pads or footprints are formed on the first surface of the interconnection structure, each one through semiconductor via in the at least one semiconductor layer is filled with conductive materials and is connected to a corresponding one exposed pad or footprint on the first surface of the interconnection structure.

In accordance with an embodiment, each one exposed pad or footprint on the first surface of the interconnection structure may be coupled to a corresponding one pad/connection/terminal on a top surface of the plurality of driver dies/chips through a micro bump.

In accordance with an embodiment, the at least one rewiring layer may comprise a plurality of lateral interposing layers configured to provide wiring and electrical conductive routes in a lateral direction and a plurality of vertical routing vias configured to provide wiring and electrical conductive routes in a vertical direction.

In accordance with an embodiment, the plurality of lateral interposing layers comprise L levels, wherein L is an integer greater than 1, and wherein for each i from 1 to L, a plurality of $i^{th}$ level interposing layers are disposed at a lateral surface having an $i^{th}$ vertical distance away from a second surface of the at least one semiconductor layer, and wherein the second surface of the at least one semiconductor layer is opposite to the first surface of the at least one semiconductor layer.

In accordance with an embodiment, each one of the plurality of first level interposing layers may be configured to electrically couple one or more of the through semiconductor vias together.

In accordance with an embodiment, the interconnection structure has a plurality of exposed conductive pads or footprints on the second surface, and the plurality of vertical routing vias may comprise a plurality of first type vertical routing vias configured to electrically couple one or more of the plurality of lateral interposing layers to one or more of the plurality of exposed conductive pads or footprints on the second surface of the interconnection structure.

In accordance with an embodiment, the plurality of vertical routing vias may further comprise a plurality of second type vertical routing vias configured to provide electrical coupling between different lateral interposing layers in the vertical direction.

In accordance with an embodiment, a geometrical pattern of the exposed pads or footprints on the first surface of the interconnection structure is identical to a geometrical pattern of pads/connections/terminals on a top surface of the plurality of driver dies/chips.

In accordance with an embodiment, the exposed pads or footprints on the first surface of the interconnection structure match with pads/connections/terminals on a top surface of the plurality of driver dies/chips.

In accordance with an embodiment, a geometrical pattern of the exposed conductive pads or footprints on the second surface of the interconnection structure is identical to a geometrical pattern of pads/connections/terminals on a bottom surface of the LED matrix.

In accordance with an embodiment, the exposed conductive pads or footprints on the second surface of the interconnection structure match with the pads/connections/terminals on the bottom surface of the LED matrix.

In accordance with an embodiment, for each individual driver die/chip, an array of discrete pads and at least one common pad are formed on a top surface of the individual driver die/chip, and wherein the array of discrete pads are separated from each other, and wherein the at least one common pad is separated from each one of the array of discrete pads. In an embodiment, number of the discrete pads on the top surface of the individual driver die/chip is identical/equal to the predetermined number of driver modules/pixels in the individual driver die/chip, and wherein number of the at least one common pad is less than the number of the discrete pads.

In accordance with an embodiment, each one discrete pad of the array of discrete pads comprises a piece of conductive material of a predetermined geometric shape, and the at least one common pad comprises a piece of conductive material larger than each one discrete pad. In an alternative example, the at least one common pad comprises a piece of conductive material distributed across the entire top surface of the individual driver die/chip, and the array of discrete pads comprises an array of small pieces carved out from the piece of conductive material that form the at least one common pad.

There has also been provided, in accordance with an embodiment of the present disclosure, a LED driving system, comprising: a LED matrix having a plurality of sub LED matrix sections, each one of the plurality of sub LED matrix sections comprises a predetermined number of LED pixels, wherein the predetermined number is an integer greater than 1; a corresponding plurality of driver dies/chips; and an interconnection structure, disposed between the LED matrix and the corresponding plurality of driver dies/chips, and configured to electrically couple each one of the plurality of sub LED matrix sections to a corresponding one driver die/chip in the corresponding plurality of driver dies/chips, the interconnection structure comprising at least one semiconductor layer having a plurality groups of through semiconductor vias formed in the at least one semiconductor layer.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Those skilled in the art should understand that the meanings of the terms identified above do not necessarily limit the terms, but merely provide illustrative examples for the terms.

Figure 2A:
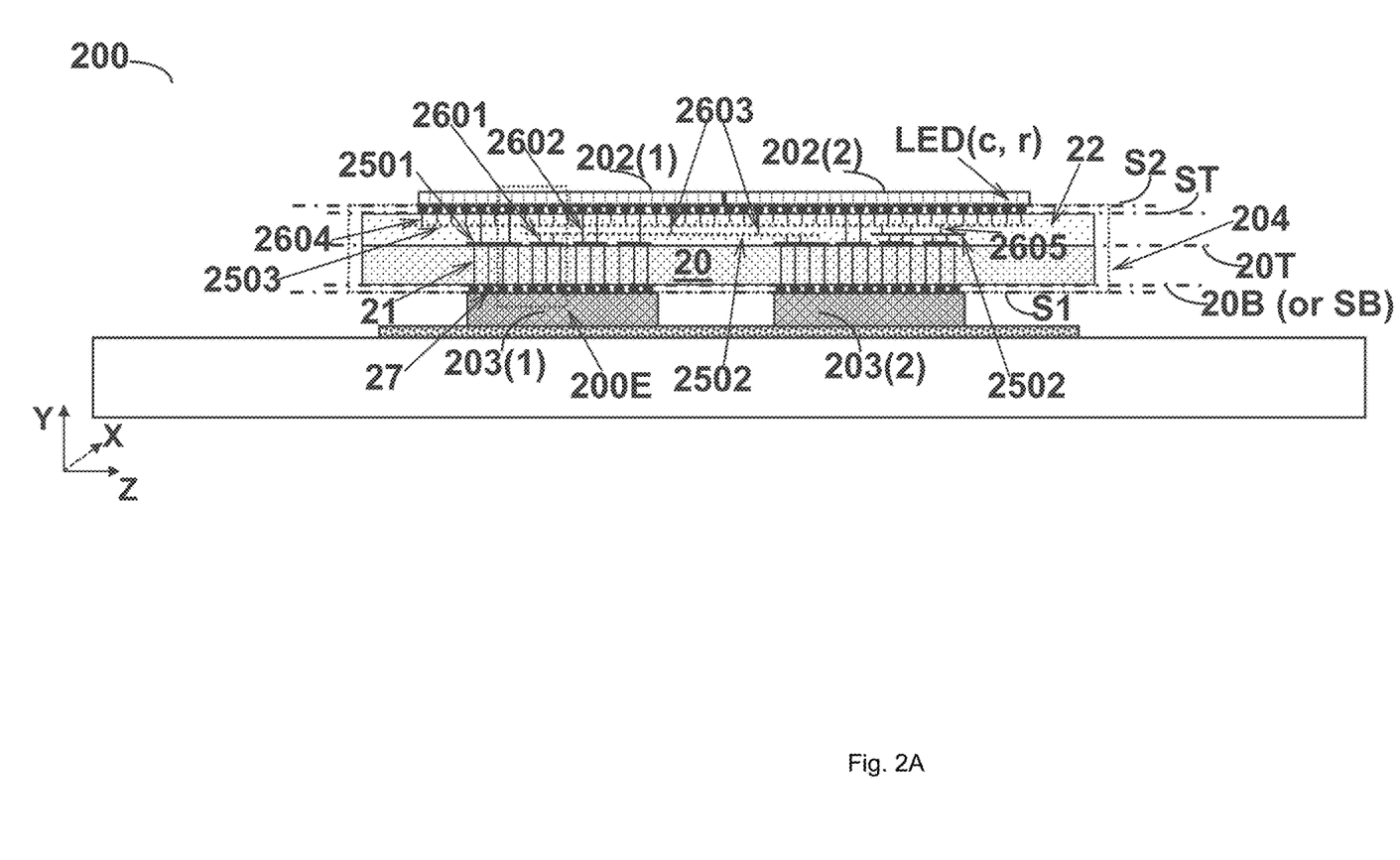
FIG. 2A illustrates a cross sectional view of a LED matrix driving system 200 in accordance with an embodiment of the present invention
Figure 2B:
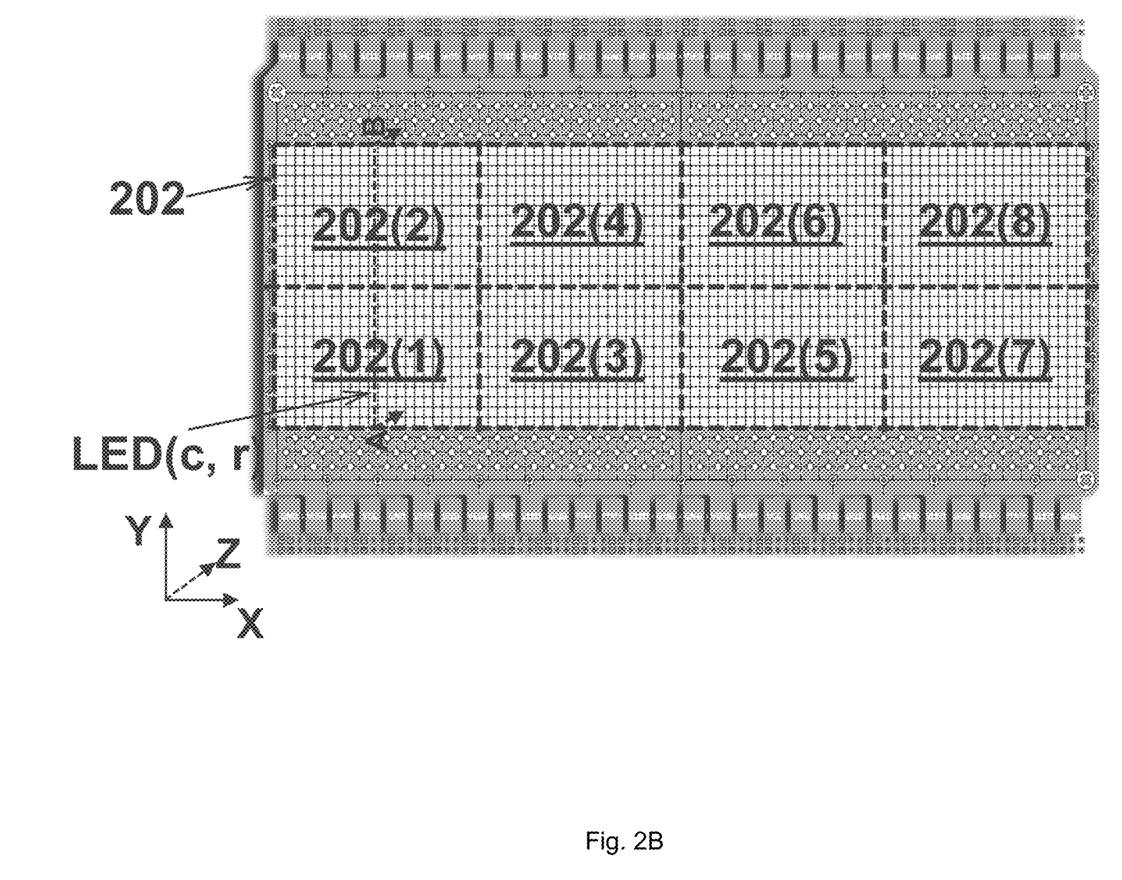
FIG. 2B illustrates a top plan view of the LED matrix driving system 200 in accordance with an embodiment of the present invention.

FIG. 2A illustrates a cross sectional view of a LED matrix driving system 200 in accordance with an embodiment of the present invention. FIG. 2B illustrates a top plan view of the LED matrix driving system 200 in accordance with an embodiment of the present invention. The cross-sectional and top plan views in FIG. 2A and FIG. 2B are illustrated out in a 3 dimensional coordinate system having the x axis, y axis and z axis perpendicular to one another. The cross-sectional view in FIG. 2A illustrates a portion corresponding to a plane cut from the cutting line AB down in the z axis direction in the top plan view in FIG. 2B. Throughout this disclosure, lateral refers to a direction parallel to the x-axis and width refers to a dimension measured in the x dimension while vertical refers to a direction parallel to the y-axis and depth or thickness refers to a dimension measured in the y dimension.

In accordance with an embodiment of the present invention, the LED matrix driving system 200 may be provided to drive a LED matrix 202 including a plurality of LEDs connected in parallel and arranged in a LED matrix of M rows and N columns, expressed by {LED(c, r), c=0, 1, . . . , N−1, r=0, 1, . . . , M−1}, wherein M and N are integers greater than 1. Each one LED (also mentioned as one LED pixel), e.g. the one LED pixel LED(c, r) in the $c^{th}$ column and $r^{th}$ row in the LED matrix may be connected between a positive pad and a negative pad, wherein c is an integer ranging from 0 to N−1, and r is an integer ranging from 0 to M−1. The LED matrix driving system 200 may comprise a corresponding plurality of driver modules, wherein each one of the corresponding plurality of driver modules is configured to drive a corresponding one of the plurality of LEDs. Each one of the plurality of driver modules may also be referred to as one driver pixel. That is to say, for the LED matrix of M rows and N columns, the LED matrix driving system 200 may comprise M by N (i.e. M*N) driver modules/pixels, expressed by {DRV(c, r), c=0, 1, . . . , N−1, r=0, 1, . . . , M−1}. For each c=0, 1, . . . , N−1 and r=0, 1, . . . , M−1, each one (driver pixel) of the M by N driver modules/pixels, e.g. the driver pixel DRV(c, r) is configured to drive the corresponding one LED pixel LED (c, r). To provide an example for helping to better understand the embodiments of the present invention, the LED matrix

202 may be of 28 rows and 88 columns, as illustrated in the exemplary embodiment of FIG. 2B, i.e., M=28, N=88. Correspondingly, there may be 56*88 driver modules or driver pixels. For each c=0, 1, ..., 87 and r=0, 1, ..., 27, the driver module/pixel DRV(c, r) is configured to drive the corresponding one LED pixel LED(c, r).

Figure 2C:
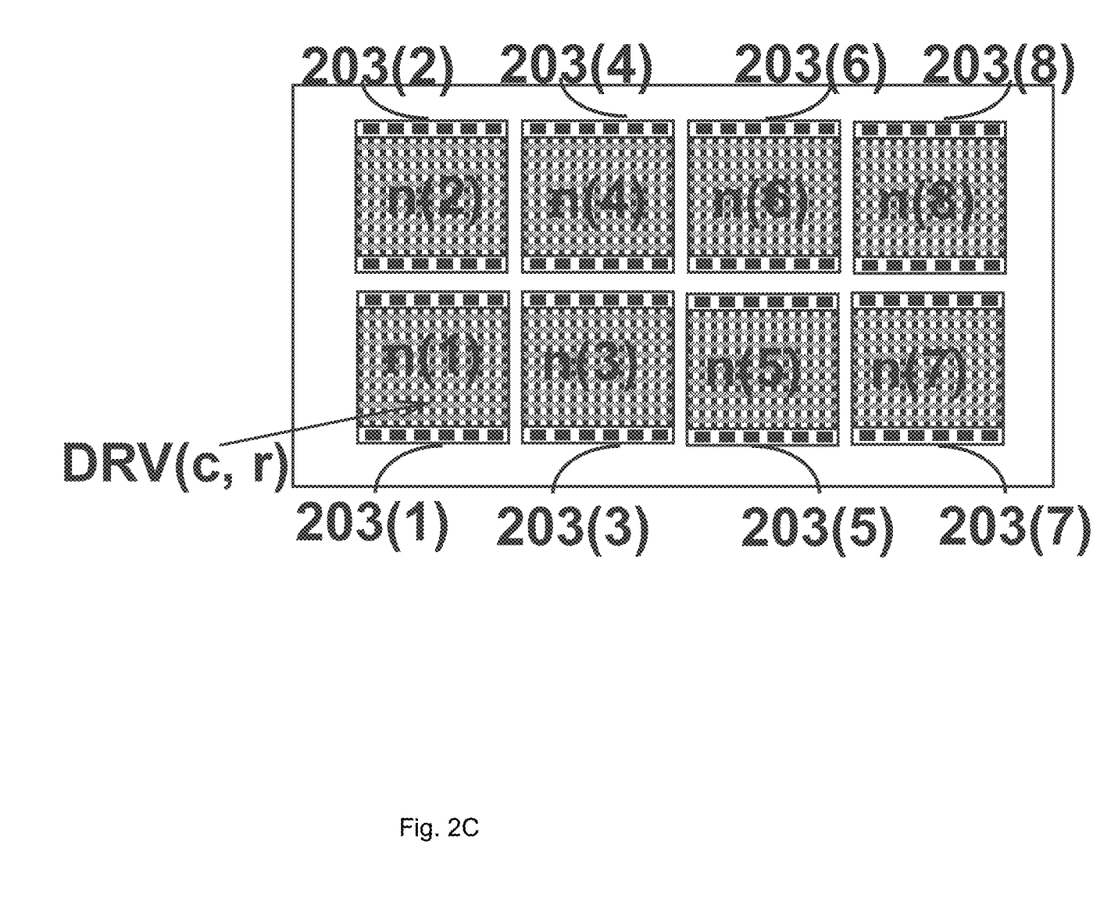
FIG. 2C illustrates a top plan view of the plurality of (i.e. G) driver dies/chips {203(1), 203(2), . . . , 203(G)} inspected from a top surface S1 of the driver dies/chips {203(1), 203(2), . . . , 203(G)} in accordance with an exemplary embodiment of the present invention.

In accordance with an exemplary embodiment, the M by N (i.e. M*N) driver modules/pixels {DRV(c, r), c=0, 1, ..., N−1, r=0, 1, ..., M−1} may be partitioned into a plurality of driver groups and integrated into a corresponding plurality of driver dies/chips by group, wherein each one driver group of the plurality of driver groups may include a predetermined number of driver modules/pixels. That is to say, the predetermined number of driver modules/pixels in each one of the driver groups are integrated into a corresponding one driver die/chip. To this sense, one of ordinary skill in the art would understand that, for simplicity, in the present disclosure, it may also be referred to as that the M by N (i.e. M*N) driver modules/pixels {DRV(c, r), c=0, 1, ..., N−1, r=0, 1, ..., M−1} are partitioned and integrated into a plurality of driver dies/chips, wherein each one driver die/chip of the plurality of driver dies/chips include a predetermined number of driver modules/pixels. For example, if the number of driver groups or driver dies/chips is denoted by a variable G, wherein G is an integer greater than 1, the driver dies/chips may be labeled with 203(1), 203(2), ..., 203(G). FIG. 2C illustrates a top plan view of the plurality of (i.e. G) driver dies/chips {203(1), 203(2), ..., 203(G)} inspected from a top surface S1 of the driver dies/chips {203(1), 203(2), ..., 203(G)} in accordance with an exemplary embodiment of the present invention. For each i from 1 to G, each one driver die/chip 203(i) of the plurality of (i.e. G) driver dies/chips {203(1), 203(2), ..., 203(G)} may comprise a predetermined number n(i) of driver modules/pixels, wherein the predetermined number n(i) is a positive integer. The black and white squares schematically illustrate a geometrical pattern of pads/connections/terminals on top surface S1 of the driver dies/chips {203(1), 203(2), ..., 203(G)}. However, one of ordinary skill in the art should understand that this is just for illustration purpose and does not represent or limit the real or practical geometrical pattern of pads/connections/terminals on top surface S1 of the driver dies/chips {203(1), 203(2), ..., 203(G)}.

In accordance with an exemplary embodiment, the LED matrix 202 may also be divided/partitioned into a plurality of sub LED matrix sections corresponding to the plurality of driver dies/chips. That is to say, if the M by N (i.e. M*N) driver modules/pixels {DRV(c, r), c=0, 1, ..., N−1, r=0, 1, ..., M−1} are partitioned and integrated into G driver dies/chips {203(1), 203(2), ..., 203(G)}, the LED matrix 202 comprising the M by N LED pixels {LED(c, r), c=0, 1, ..., N−1, r=0, 1, ..., M−1} may correspondingly be divided/partitioned into G sub LED matrix sections {202(1), 202(2), ..., 202(G)}. For each i from 1 to G, each one driver die/chip 203(i) of the plurality of driver dies/chips {203(1), 203(2), ..., 203(G)} may be configured to drive a corresponding one sub LED matrix section 202(i) of the plurality of sub LED matrix sections {202(1), 202(2), ..., 202(G)}. In consequence, for each i from 1 to G, each one sub LED matrix section 202(i) may comprise the predetermined number n(i) of LED pixels which are correspondingly driven by the predetermined number n(i) of driver modules/pixels in the driver die/chip 203(i).

One of ordinary skill in the art should understand that there are totally G predetermined numbers {n(i), i=1, 2, ..., G} associated to the G driver dies/chips {203(1), 203(2), ..., 203(G)} and the corresponding G sub LED matrix sections {202(1), 202(2), ..., 202(G)}. The predetermined number n(i) associated to the one driver die/chip 203(i) and the corresponding one sub matrix section 202(i) may be appropriately chosen or designed according to practical application specifications and may vary from one application to another. In an embodiment, for each i from 1 to G, the predetermined number n(i) may be identical or equal to each other, i.e. n(1)=n(2)= ... =n(G). This may also be mathematically expressed by n(i+1)=n(i), for each i from 1 to (G−1). In an alternative embodiment, the predetermined number n(i) may be equal to some of the rest of (G−1) predetermined numbers {n(i), i=1, 2, ..., (i−1), (i+1), ..., G} while different from the others. In still an alternative embodiment, all of the G predetermined numbers {n(i), i=1, 2, ..., G} may be different from one another.

For helping to better understand the embodiments of the present invention, still taking M=28 and N=88 as an example, in the example of FIG. 2C, the 28*88 driver modules or driver pixels {DRV(c, r), c=0, 1, ..., 87, r=0, 1, ..., 27} are illustrated as being partitioned and integrated into 8 driver dies/chips {203(1), 203(2), 203(3), 203(4), 203(5), 203(6), 203(7), 203(8)}. Correspondingly, as shown in the example of FIG. 2B, the 28*88 LED pixels of the LED matrix 202 is divided/partitioned into 8 sub LED matrix sections {202(1), 202(2), ..., 202(8)}. That is to say, G=8 in these examples. For each i from 1 to 8, the driver die/chip 203(i) may comprise 14*22 (i.e. n(i)=14*22 in this example) driver modules/pixels. That is to say, in the example of FIG. 2C, the 8 predetermined numbers {n(1), n(2), n(3), n(4), n(5), n(6), n(7), n(8)} respectively associated to the 8 driver dies/chips {203(1), 203(2), 203(3), 203(4), 203(5), 203(6), 203(7), 203(8)} are identical and equal to 14*22, i.e., n(1)=n(2)=n(3)=n(4)=n(5)=n(6)=n(7)=n(8)=14*22. The driver die/chip 203(1) may comprise the 14*22 driver modules/pixels {DRV(c, r), c=0, 1, ..., 21, r=0, 1, ..., 13}, the sub LED matrix section 202(1) may comprise the 14*22 LED pixels {LED(c, r), c=0, 1, ..., 21, r=0, 1, ..., 13} which are correspondingly driven by the 14*22 driver modules/pixels {DRV(c, r), c=0, 1, ..., 21, r=0, 1, ..., 13} in the driver die/chip 203(1). The driver die/chip 203(2) may comprise the 14*22 driver modules/pixels {DRV(c, r), c=0, 1, ..., 21, r=14, 15, ..., 27}, the sub LED matrix section 202(2) may comprise the 14*22 LED pixels {LED(c, r), c=0, 1, ..., 21, r=14, 15, ..., 27} which are correspondingly driven by the 14*22 driver modules/pixels {DRV(c, r), c=0, 1, ..., 21, r=14, 15, ..., 27} in the driver die/chip 203(2). The driver die/chip 203(3) may comprise the 14*22 driver modules/pixels {DRV(c, r), c=22, 23, ..., 43, r=0, 1, ..., 13}, the sub LED matrix section 202(3) may comprise the 14*22 LED pixels {LED(c, r), c=22, 23, ..., 43, r=0, 1, ..., 13} which are correspondingly driven by the 14*22 driver modules/pixels {DRV(c, r), c=22, 23, ..., 43, r=0, 1, ..., 13} in the driver die/chip 203(3). The driver die/chip 203(4) may comprise the 14*22 driver modules/pixels {DRV(c, r), c=22, 23, ..., 43, r=14, 15, ..., 27}, the sub LED matrix section 202(4) may comprise the 14*22 LED pixels {LED(c, r), c=22, 23, ..., 43, r=14, 15, ..., 27} which are correspondingly driven by the 14*22 driver modules/pixels {DRV(c, r), c=22, 23, ..., 43, r=14, 15, ..., 27} in the driver die/chip 203(4). The driver die/chip 203(5) may comprise the 14*22 driver modules/pixels {DRV(c, r), c=44, 45, ..., 65, r=0, 1, ..., 13}, the sub LED matrix section 202(5) may comprise the 14*22 LED pixels {LED(c, r), c=44, 45, ..., 65, r=0, 1, ..., 13} which are correspondingly driven by the 14*22 driver modules/pixels {DRV(c, r), c=44, 45, . . . , 65, r=0, 1, . . . , 13} in the driver die/chip 203(5). The driver die/chip 203(6) may comprise the 14*22 driver modules/pixels {DRV(c, r), c=44, 45, . . . , 65, r=14, 15, . . . , 27}, the sub LED matrix section 202(6) may comprise the 14*22 LED pixels {LED(c, r), c=44, 45, . . . , 65, r=14, 15, . . . , 27} which are correspondingly driven by the 14*22 driver modules/pixels {DRV(c, r), c=44, 45, . . . , 65, r=14, 15, . . . , 27} in the driver die/chip 203(6). The driver die/chip 203(7) may comprise the 14*22 driver modules/pixels {DRV(c, r), c=66, 67, . . . , 87, r=0, 1, . . . , 13}, the sub LED matrix section 202(7) may comprise the 14*22 LED pixels {LED(c, r), c=66, 67, . . . , 87, r=0, 1, . . . , 13} which are correspondingly driven by the 14*22 driver modules/pixels {DRV(c, r), c=66, 67, . . . , 87, r=0, 1, . . . , 13} in the driver die/chip 203(7). The driver die/chip 203(8) may comprise the 14*22 driver modules/pixels {DRV(c, r), c=66, 67, . . . , 87, r=14, 15, . . . , 27}, the sub LED matrix section 202(8) may comprise the 14*22 LED pixels {LED(c, r), c=66, 67, . . . , 87, r=14, 15, . . . , 27} which are correspondingly driven by the 14*22 driver modules/pixels {DRV(c, r), c=66, 67, . . . , 87, r=14, 15, . . . , 27} in the driver die/chip 203(8). One of ordinary skill in the art should understand that this is just an example and is not intended to be limiting. In an alternative example, one may choose n(1)=14*11, n(2)=n(3)=14*33, n(4)=14*11, n(5)=n(6)=n(7)=n(8)=14*22.

Partitioning the M by N (i.e. M*N) driver modules/pixels {DRV(c, r), c=0, 1, . . . , N−1, r=0, 1, . . . , M−1} into groups and integrating them by group into a plurality of driver dies/chips {203(1), 203(2), . . . , 203(G)} according to various embodiments of the present invention, in comparison with integrating all of them into a single LED die/chip, may advantageously reduce warpage in each driver die/chip and improve yield (e.g. yield may be higher than 90%). This may also allow more flexibility in design of the LED driving system 200 and facilitate customers in practical applications in various ways. For instance, when one of the driver dies/chips {203(1), 203(2), . . . , 203(G)} is broken, customer may only need to change the broken one with a new one without the need of changing all of the driver dies/chips.

In accordance with an embodiment of the present invention, as illustrated in FIG. 2A, the LED matrix driving system 200 may further comprise an interconnection structure 204 disposed between the plurality of driver dies/chips {203(1), 203(2), . . . , 203(G)} and the LED matrix 202 and configured to electrically couple each one of LED driver die/chip 203(i) to the corresponding one sub LED matrix section 202(i) of the plurality of sub LED matrix sections {202(1), 202(2), . . . , 202(G)}, for each i from 1 to G. The interconnection structure 204 has a first surface (e.g. bottom surface of 204 illustrated in FIG. 2A) SB and a second surface (e.g. top surface of 204 illustrated in FIG. 2A) ST opposite to the first surface SB. The first surface SB may be configured to interface with the plurality of driver dies/chips {203(1), 203(2), . . . , 203(G)}. The second surface ST may be configured to interface with the LED matrix 202 including the plurality of sub LED matrix sections {202(1), 202(2), . . . , 202(G)}. For example, the plurality of driver dies/chips {203(1), 203(2), . . . , 203(G)} may be attached to the first surface SB of the interconnection structure 204, and the plurality of LED pixels {LED(c, r), c=0, 1, . . . , N−1, r=0, 1, . . . , M−1} of the LED matrix 202 may be attached to the second surface ST of the interconnection structure 204.

The interconnection structure 204 may comprise at least one semiconductor layer (e.g. silicon layer) having a surface used as the first surface SB with through semiconductor vias ("TSV", e.g. vias 22 in FIG. 2A) formed in the at least one semiconductor layer. The through semiconductor vias may be filled with conductive materials (such as metal, alloy etc.) and connected to exposed pads or footprints on the first surface SB so as to interface with the plurality of driver dies/chips {203(1), 203(2), . . . , 203(G)}. The through semiconductor vias may be electrically coupled to pads/connections/terminals on top surface S1 of the driver dies/chips {203(1), 203(2), . . . , 203(G)} for instance through the exposed pads or footprints on the first surface SB of the interconnection structure 204. A geometrical pattern of the exposed pads or footprints on the first surface SB of the interconnection structure 204 may be identical or at least corresponding to a geometrical pattern of pads/connections/terminals on top surface S1 of the driver dies/chips {203(1), 203(2), . . . , 203(G)}. For example, the exposed pads or footprints on the first surface SB of the interconnection structure 204 match with pads/connections/terminals on top surface S1 of the driver dies/chips {203(1), 203(2), . . . , 203(G)}.

The interconnection structure 204 may further comprise at least one rewiring or redistribution layer formed on the at least one semiconductor layer. The at least one rewiring or redistribution layer may have a surface used as the second surface ST of the interconnection structure 204 and may have exposed conductive pads or footprints on the second surface ST so as to interface with the LED matrix 202 (i.e. the plurality of sub LED matrix sections {202(1), 202(2), . . . , 202(G)}). A geometrical pattern of the exposed conductive pads or footprints on the second surface ST of the interconnection structure 204 may be identical or at least corresponding to a geometrical pattern of pads/connections/terminals on a bottom surface S2 of the LED matrix 202. For example, the exposed conductive pads or footprints on the second surface ST of the interconnection structure 204 match with pads/connections/terminals on bottom surface S2 of the driver dies/chips {203(1), 203(2), . . . , 203(G)}.

The at least one rewiring or redistribution layer may comprise a plurality of lateral interposing layers and a plurality of vertical routing vias in the vertical direction. The plurality of lateral interposing layers may be configured to provide wiring and electrical conductive routes in the lateral direction, for example some of the plurality of lateral interposing layers may be configured to provide electrical conductive routes in the lateral direction for circuit elements within each one of the driver dies/chips {203(1), 203(2), . . . , 203(G)}. Some other of the plurality of lateral interposing layers may be configured to provide electrical conductive routes in the lateral direction between circuit elements in different driver dies/chips of the plurality of driver dies/chips {203(1), 203(2), . . . , 203(G)}. The plurality of vertical routing vias are configured to provide wiring and electrical conductive routes in the vertical direction. For instance, some of the plurality of vertical routing vias may be used to provide electrical coupling for example between one or more lateral interposing layers and one or more exposed conductive pads or footprints on the second surface ST of the interconnection structure 204. Some other of the plurality of vertical routing vias may be used to provide electrical coupling for example between lateral interposing layers at different vertical levels/positions. Positions, sizes and number of the plurality of lateral interposing layers and the plurality of vertical routing vias may be designed or chosen according to practical application requirements. Individual lateral interposing layers and individual vertical routing vias are separated from each other by dielectric material.

Figure 2D:
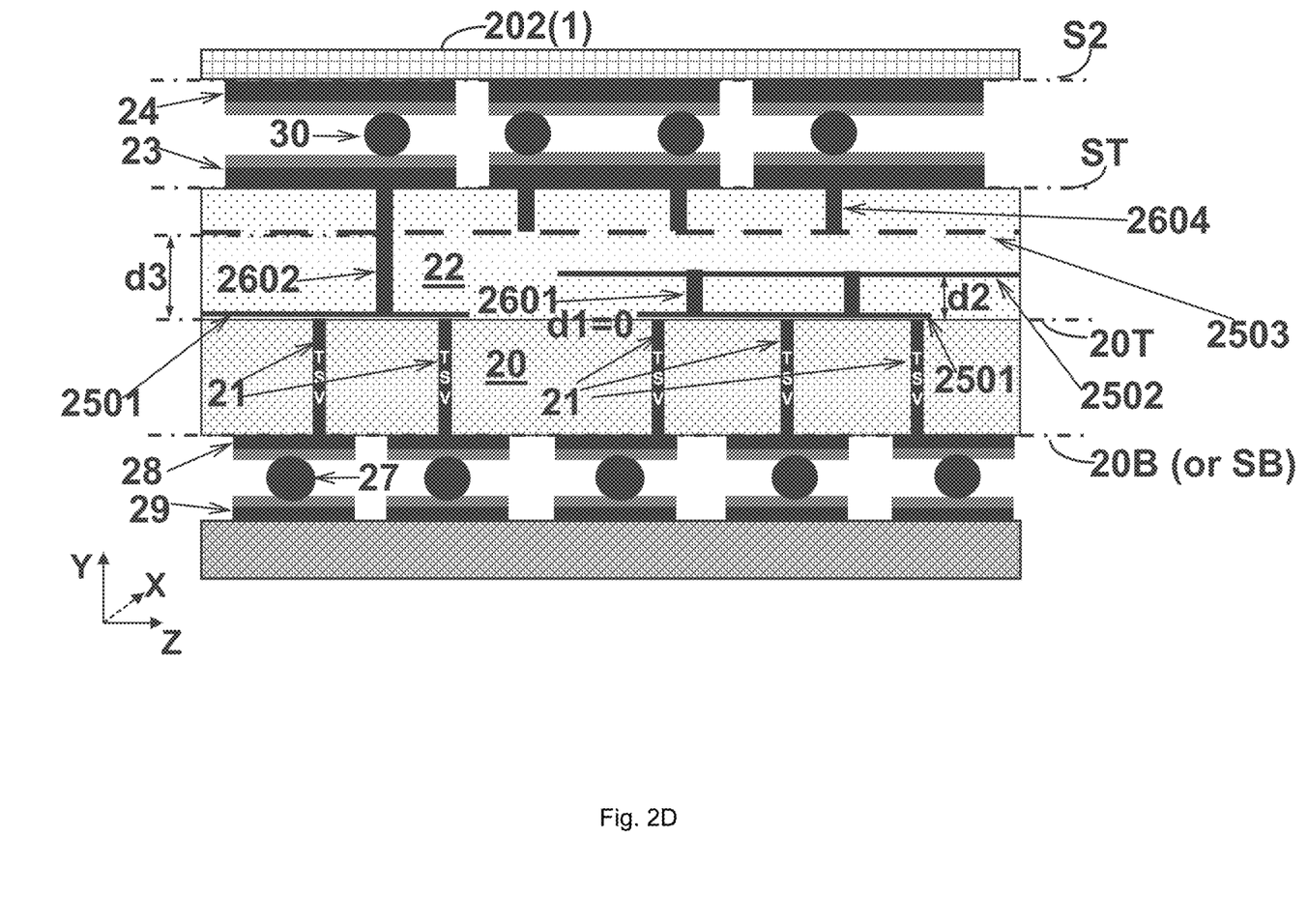
FIG. 2D illustrates an enlarged cross sectional view of a portion (e.g. the portion in the dashed line frame 200E in FIG. 2A) of the interconnection structure 204 of FIG. 2A.

In the following, referring to the cross sectional illustrations of FIG. 2A and FIG. 2D, an example for helping to better understand embodiments of the present invention will be provided. FIG. 2D illustrates an enlarged cross sectional view of a portion (e.g. the portion in the dashed line frame 200E in FIG. 2A) of the interconnection structure 204 of FIG. 2A. In an exemplary embodiment, the interconnection structure 204 may comprise at least one semiconductor layer e.g. labeled with 20 having a first surface 20B (e.g. bottom surface of 20 in the example of FIG. 2A) and a second surface 20T (e.g. top surface of 20 in the example of FIG. 2A) opposite to the first surface 20B. The at least one semiconductor layer 20 may comprise multiple layers formed of semiconductors such as Si, Se, GaN etc. And a plurality groups of through semiconductor vias 21 corresponding to the plurality of driver dies/chips {203(1), 203(2), ..., 203(G)} may be formed in the at least one semiconductor layer 20. Each one group of through semiconductor vias 21 corresponds to one of the plurality of driver dies/chips {203(1), 203(2), ..., 203(G)} for leading pads/connections/terminals on top surface S1 of the driver dies/chips {203(1), 203(2), ..., 203(G)} out. That is to say, the LED matrix driving system 200 comprises G groups of through semiconductor vias 21 in the example where the M by N (i.e. M*N) driver modules/pixels {DRV(c, r), c=0, 1, ..., N−1, r=0, 1, ..., M−1} are partitioned and integrated into G driver dies/chips {203(1), 203(2), ..., 203(G)}. Each through semiconductor via 21 may extend vertically from the first surface 20B in the direction parallel to the y-axis through the semiconductor layer 20 to reach the second surface 20T. Each one through semiconductor via 21 may be connected to a corresponding one exposed pad or footprint 28 on the first surface 20B of the semiconductor layer 20 (also used as the first surface SB of the interconnection structure 204) and may be coupled to a corresponding one pad/connection/terminal (e.g. labeled with 29 in FIG. 2D) on top surface S1 of the driver dies/chips {203(1), 203(2), ..., 203(G)} through for example a micro bump 27. Pitch of the through semiconductor vias 21 may be smaller than 165 μm which is much smaller than pitch of wire/trace of conventional redistribution layer formed by photolithography, etching and electroplating processes. Therefore, using the at least one semiconductor layer 20 having the plurality groups of through semiconductor vias 21 to couple and lead out the pads/connections/terminals of the driver dies/chips {203(1), 203(2), ..., 203(G)} advantageously allow each driver die/chip to have reduced size.

In the exemplary embodiment illustrated in FIGS. 2A and 2D, the interconnection structure 204 may further comprise at least one rewiring or redistribution layer 22 formed on the at least one semiconductor layer 20. The at least one rewiring or redistribution layer 22 may have a top surface used as the second surface ST of the interconnection structure 204 and may have exposed conductive pads or footprints (e.g. labeled with 23 in FIG. 2D) on the second surface ST so as to interface with the LED matrix 202 (i.e. the plurality of sub LED matrix sections {202(1), 202(2), ..., 202(G)}). A geometrical pattern of the exposed conductive pads or footprints 23 on the second surface ST of the interconnection structure 204 may be identical or at least corresponding to a geometrical pattern of pads/connections/terminals (e.g. labeled with 24 in FIG. 2D) on a bottom surface S2 of the LED matrix 202. The at least one rewiring or redistribution layer 22 may comprise a plurality of lateral interposing layers (e.g. labeled with 2501, 2502, 2503) for providing wiring and electrical conductive routes in the lateral direction and a plurality of vertical routing vias (e.g. labeled with 2601, 2602, 2603, 2604, 2605) for providing wiring and electrical conductive routes in the vertical direction.

The plurality of lateral interposing layers (e.g. labeled with 2501, 2502, 2503) may comprise a plurality of first level interposing layers such as those labeled with 2501 spatially disposed at a lateral surface having a first vertical distance d1 away from the second surface (e.g. top surface) 20T of the at least one semiconductor layer 20, the first vertical distance d1 may be equal or greater than zero. In the example of FIG. 2A and FIG. 2D, it is illustrated that d1=0, i.e. the plurality of first level interposing layers 2501 are formed on the second surface (e.g. top surface) 20T of the at least one semiconductor layer 20. Each one of the plurality of first level interposing layers 2501 may be used to electrically couple one or more of the through semiconductor vias 21 that need to be coupled together according to practical design and application requirements. The plurality of lateral interposing layers (e.g. labeled with 2501, 2502, 2503) may further comprise a plurality of second level interposing layers such as those labeled with 2502 spatially disposed at a lateral surface having a second vertical distance d2 away from the second surface (e.g. top surface) 20T of the at least one semiconductor layer 20. The second vertical distance d2 is greater than the first vertical distance d1. The plurality of lateral interposing layers (e.g. labeled with 2501, 2502, 2503) may further comprise a plurality of third level interposing layers such as those labeled with 2503 spatially disposed at a lateral surface having a third vertical distance d3 away from the second surface (e.g. top surface) 20T of the at least one semiconductor layer 20. The third vertical distance d3 is greater than the second vertical distance d2. Although in the exemplary embodiments in FIG. 2A and FIG. 2D, three levels of interposing layers are illustrated out, one of ordinary skill in the art would understand that this is just for illustration purpose and not intended to be limiting. The plurality of lateral interposing layers may comprise L levels, wherein L is an integer greater than 1, L>1. Herein, for each i from 1 to L, "a plurality of $i^{th}$ level interposing layers" may refer to those interposing layers that are disposed at a lateral surface having an $i^{th}$ vertical distance away from the second surface (e.g. top surface) 20T of the at least one semiconductor layer 20. For each i from 1 to (L−1), the $(i+1)^{th}$ vertical distance is greater than the $i^{th}$ vertical distance. In the example where the plurality of first level interposing layers are formed on the second surface (e.g. top surface) 20T of the at least one semiconductor layer 20, the first vertical distance is zero. Positions, sizes and numbers of the plurality of lateral interposing layers may be designed or chosen according to practical application requirements.

The plurality of vertical routing vias (e.g. labeled with 2601, 2602, 2603, 2604, 2605) may comprise a first plurality of vertical routing vias such as those labeled with 2601 configured to electrically couple one or more of the plurality of first level interposing layers 2501 to one or more of the plurality of second level interposing layers 2502. The plurality of vertical routing vias (e.g. labeled with 2601, 2602, 2603, 2604, 2605) may further comprise a second plurality of vertical routing vias such as those labeled with 2602 configured to electrically couple one or more of the plurality of first level interposing layers 2501 to one or more of the exposed conductive pads or footprints 23 on the second surface ST of the interconnection structure 204. The plurality of vertical routing vias (e.g. labeled with 2601, 2602, 2603, 2604, 2605) may further comprise a third plurality of vertical routing vias such as those labeled with 2603 configured to electrically couple one or more of the plurality of second level interposing layers 2502 to one or more of the exposed conductive pads or footprints 23 on the second surface ST of the interconnection structure 204. The plurality of vertical routing vias (e.g. labeled with 2601, 2602, 2603, 2604, 2605) may further comprise a fourth plurality of vertical routing vias such as those labeled with 2604 configured to electrically couple one or more of the plurality of third level interposing layers 2503 to one or more of the exposed conductive pads or footprints 23 on the second surface ST of the interconnection structure 204. The plurality of vertical routing vias (e.g. labeled with 2601, 2602, 2603, 2604, 2605) may further comprise a fifth plurality of vertical routing vias such as those labeled with 2605 configured to electrically couple one or more of the plurality of second level interposing layers 2502 to one or more of the plurality of third level interposing layers 2503. Although in the exemplary embodiments in FIG. 2A and FIG. 2D, the vertical routing vias labeled with 2601, 2602, 2603, 2604 and 2605 are illustrated out as examples, one of ordinary skill in the art would understand that this is just for illustration purpose and not intended to be limiting. One of ordinary skill in the art should understand that positions, sizes and numbers of the plurality of vertical routing vias may be designed or chosen according to practical application requirements. In brief, the plurality of vertical routing vias may be considered to comprise a plurality of first type vertical routing vias (such as those labeled with 2602, 2603 and 2604) configured to electrically coupled one or more of the plurality of lateral interposing layers to one or more of the exposed conductive pads or footprints (e.g. labeled with 23 in FIG. 2D) on the second surface ST of the interconnection structure 204, and a plurality of second type vertical routing vias (such as those labeled with 2601 and 2605) configured to provide electrical coupling in the vertical direction between one or more different lateral interposing layers. That is to say, in the example where L levels of lateral interposing layers is mentioned, the plurality of second type vertical routing vias may be configured to electrically couple one or more of the plurality of $i^{th}$ level interposing layers to one or more lateral interposing layers other than those of the plurality of $i^{th}$ level interposing layers, i can be from 1 to L. Each one of the exposed conductive pads or footprints 23 on the second surface ST of the interconnection structure 204 may be coupled to a corresponding one pad/connection/terminal (e.g. labeled with 24 in FIG. 2D) on bottom surface S2 of the LED matrix 202 through for example a micro bump 30.

With the interconnection structure 204, the LED driving system 200 in accordance with various embodiments of the present invention may support to drive LED matrix comprised of next generation mini/micro LEDs with pitch of a single pad of each LED pixel no larger than 60 μm and maximum driving current required by each LED pixel may be 6.5 mA. This may advantageously help to reduce the total size, heat dissipation and power consumption of the LED driving system 200.

Figure 3:
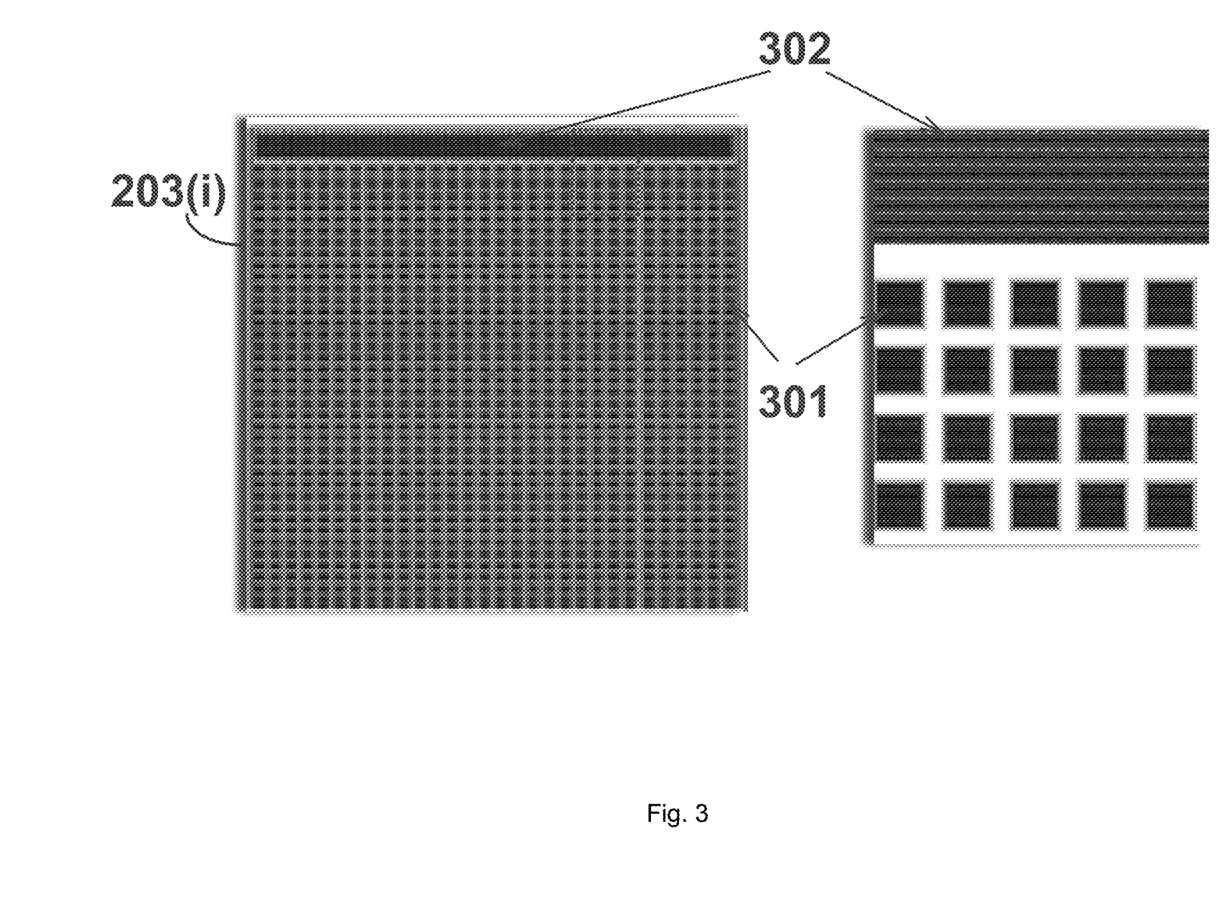
FIG. 3 illustrates a portion of an exemplary geometrical pattern of the exposed pads or footprints on the first surface SB of the interconnection structure 204 or of the pads/connections/terminals on top surface S1 of the driver dies/chips {203(1), 203(2), . . . , 203(G)}.

FIG. 3 illustrates a portion of an exemplary geometrical pattern of the exposed pads or footprints on the first surface SB of the interconnection structure 204 or of the pads/connections/terminals on top surface S1 of the driver dies/chips {203(1), 203(2), . . . , 203(G)}. For instance, the portion of the exemplary geometrical pattern may be considered as of the pads/connections/terminals on top surface S1 of an individual driver die/chip 203($i$), for each i from 1 to G, or of the exposed pads or footprints on the first surface SB of a portion of the interconnection structure 204 which corresponds to the individual driver die/chip 203($i$). Herein, one of ordinary skill in the art would understand that "the portion of the interconnection structure 204 which corresponds to the individual driver die/chip 203($i$)" may be understood that the exposed pads or footprints on the first surface SB of that portion of the interconnection structure 204 will be respectively coupled to corresponding pads/connections/terminals on top surface S1 of the individual driver die/chip 203($i$). Geometrical pattern of the exposed pads or footprints on the first surface SB of that portion of the interconnection structure 204 which corresponds to the individual driver die/chip 203($i$) matches with the geometrical pattern of the corresponding pads/connections/terminals on top surface S1 of the individual driver die/chip 203($i$). In the example of FIG. 3, for each i from 1 to G, the pads/connections/terminals on top surface S1 of the individual driver die/chip 203($i$) may comprise an array of discrete pads 301 separated from each other and at least one common pad 302 separated from each one of the array of discrete pads 301. Number of the discrete pads 301 may be identical/equal to the predetermined number n(i) of driver modules/pixels in the individual driver die/chip 203($i$). Number of the at least one common pad 302 may be less than the number of discrete pads 301. In an example, each driver module/pixel in the individual driver die/chip 203($i$) may have a first terminal and a second terminal. Each one of the discrete pads 301 may be coupled to the first terminal of a corresponding one driver module/pixel in the individual driver die/chip 203($i$). The at least one common pad 302 may be coupled to the second terminals of the driver modules/pixels and used to lead out the second terminals of the driver modules/pixels in the individual driver die/chip 203($i$). For instance, in an example where a single common pad 302 is formed, the single common pad 302 may be coupled to the second terminals of all the driver modules/pixels in the individual driver die/chip 203($i$). For another instance, in an example where two common pads 302 are formed. One of the common pad 302 may be coupled to the second terminals of a portion/a first number of the driver modules/pixels in the individual driver die/chip 203($i$). And the other one of the common pad 302 may be coupled to the second terminals of the remained portion/remained number of the driver modules/pixels in the individual driver die/chip 203($i$). These are just examples and not intended to be limiting. Use the at least one common pad 302 instead of a discrete pad for the second terminal of each driver module/pixel advantageously helps to reduce the number of pads and save driver die/chip size.

For instance, in FIG. 3, the array of discrete pads 301 are illustrated with an array of small rectangular conductive materials (e.g. metal or alloy) represented by the array of small rectangular black blocks, and one common pad 302 is illustrated out with a piece of conductive material (e.g. metal or alloy) represented by a black bar distributed or disposed along an edge of the individual driver die/chip 203($i$). One of ordinary skill in the art should understand that the geometrical pattern in FIG. 3 is only illustrative and not intended to be limiting. In an alternative example, the array of discrete pads 301 may be of other shapes (e.g. round, hexagon, or other multi-lateral shape etc.) other than rectangular. In an alternative example, the at least one common pad 302 may be of other shape other than long bar, for instance rectangular or round etc. In an alternative example, the at least one common pad 302 may be disposed at other position on the top surface S1 of the individual driver die/chip 203($i$), not just confined to along an edge of the individual driver die/chip 203($i$). In an alternative example, the individual driver die/chip 203(*i*) may have more than one common pads 302, for example two or three or more (but less than the number of discrete pads 301).

Figure 4:
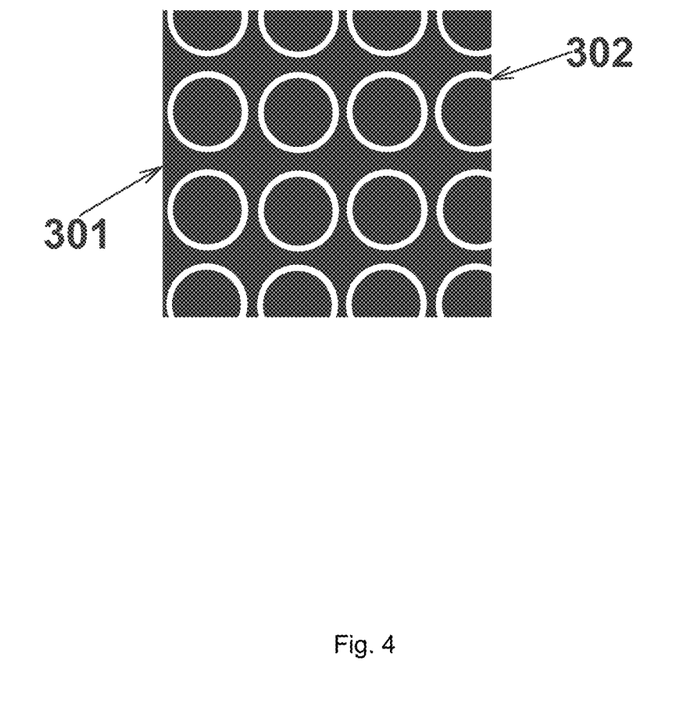
FIG. 4 illustrates an enlarged portion of an alternative exemplary geometrical pattern of the exposed pads or footprints on the first surface SB of the interconnection structure 204 or of the pads/connections/terminals on top surface S1 of the driver dies/chips {203(1), 203(2), . . . , 203(G)}.

For example, FIG. 4 illustrates an enlarged portion of an alternative exemplary geometrical pattern of the exposed pads or footprints on the first surface SB of the interconnection structure 204 or of the pads/connections/terminals on top surface S1 of the driver dies/chips {203(1), 203(2), . . . , 203(G)}. The at least one common pad 302 is illustrated as a piece of conductive material (e.g. metal or alloy) distributed across the entire top surface S1 of the individual driver die/chip 203(*i*), the array of discrete pads 301 are illustrated with an array of small round-shaped pieces carved out from the large piece of conductive material that form the at least one common pad 302. One of ordinary skill in the art should understand that the geometrical pattern in FIG. 4 is still only illustrative and not intended to be limiting.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments. Accordingly, the present invention is not limited except as by the appended claims.

What is claimed is:

1. A LED driving system, comprising:
  a LED matrix having a plurality of LED pixels;
  a plurality of driver dies/chips, wherein each one of the plurality of driver dies/chips is provided to drive a corresponding predetermined number of LED pixels in the LED matrix, and wherein the predetermined number is an integer greater than 1, and wherein for each individual driver die/chip, an array of discrete pads and at least one common pad are formed on a top surface of the individual driver die/chip, and wherein the array of discrete pads are separated from each other, and wherein the at least one common pad is separated from each one of the array of discrete pads; and
  an interconnection structure comprising at least one semiconductor layer having a plurality groups of through semiconductor vias formed in the at least one semiconductor layer and at least one rewiring layer formed on the at least one semiconductor layer, wherein the at least one semiconductor layer has a first surface used as a first surface of the interconnection structure, and wherein the at least one rewiring layer has a surface used as a second surface of the interconnection structure, and wherein the plurality of driver dies/chips are attached to the first surface of the interconnection structure, and wherein the plurality of LED pixels of the LED matrix are attached to the second surface of the interconnection structure, and wherein the interconnection structure is configured to electrically couple each one of the plurality of driver dies/chips to the corresponding predetermined number of LED pixels in the LED matrix.

2. The LED driving system of claim 1, wherein each one through semiconductor via is filled with conductive materials and is connected to a corresponding one exposed pad or footprint on the first surface of the interconnection structure.

3. The LED driving system of claim 1, wherein a plurality of exposed pads or footprints are formed on the first surface of the interconnection structure, and wherein each one exposed pad or footprint on the first surface of the interconnection structure is coupled to a corresponding one pad/connection/terminal on a top surface of the plurality of driver dies/chips through a micro bump.

4. The LED driving system of claim 1, wherein the at least one rewiring layer comprises:
  a plurality of lateral interposing layers, configured to provide wiring and electrical conductive routes in a lateral direction; and
  a plurality of vertical routing vias, configured to provide wiring and electrical conductive routes in a vertical direction.

5. The LED driving system of claim 4, wherein the plurality of lateral interposing layers comprise L levels, wherein L is an integer greater than 1, and wherein for each i from 1 to L, a plurality of $i^{th}$ level interposing layers are disposed at a lateral surface having an $i^{th}$ vertical distance away from a second surface of the at least one semiconductor layer, and wherein the second surface of the at least one semiconductor layer is opposite to the first surface of the at least one semiconductor layer.

6. The LED driving system of claim 5, wherein each one of the plurality of first level interposing layers is configured to electrically couple one or more of the through semiconductor vias together.

7. The LED driving system of claim 4, wherein the interconnection structure has a plurality of exposed conductive pads or footprints on the second surface, and wherein the plurality of vertical routing vias comprise:
  a plurality of first type vertical routing vias configured to electrically couple one or more of the plurality of lateral interposing layers to one or more of the plurality of exposed conductive pads or footprints on the second surface of the interconnection structure.

8. The LED driving system of claim 7, wherein the plurality of vertical routing vias further comprise:
  a plurality of second type vertical routing vias configured to provide electrical coupling between different lateral interposing layers in the vertical direction.

9. The LED driving system of claim 1, wherein a geometrical pattern of exposed pads or footprints on the first surface of the interconnection structure is identical to a geometrical pattern of pads/connections/terminals on a top surface of the plurality of driver dies/chips.

10. The LED driving system of claim 1, wherein exposed pads or footprints on the first surface of the interconnection structure match with pads/connections/terminals on a top surface of the plurality of driver dies/chips.

11. The LED driving system of claim 1, wherein a geometrical pattern of exposed conductive pads or footprints on the second surface of the interconnection structure is identical to a geometrical pattern of pads/connections/terminals on a bottom surface of the LED matrix.

12. The LED driving system of claim 1, wherein the exposed conductive pads or footprints on the second surface of the interconnection structure match with the pads/connections/terminals on the bottom surface of the LED matrix.

13. The LED driving system of claim 1, wherein for each individual driver die/chip, number of the discrete pads on the top surface of the individual driver die/chip is identical/equal to the predetermined number of driver modules/pixels in the individual driver die/chip, and wherein number of the at least one common pad is less than the number of the discrete pads.

14. The LED driving system of claim 1, wherein:
  each one discrete pad of the array of discrete pads comprises a piece of conductive material of a predetermined geometric shape; and wherein the at least one common pad comprises a piece of conductive material larger than each one discrete pad.

15. The LED driving system of claim 1, wherein:

the at least one common pad comprises a piece of conductive material distributed across the entire top surface of the individual driver die/chip; and wherein the array of discrete pads comprises an array of small pieces carved out from the piece of conductive material that form the at least one common pad.

16. A LED driving system, comprising:

a LED matrix having a plurality of sub LED matrix sections, each one of the plurality of sub LED matrix sections comprises a predetermined number of LED pixels, wherein the predetermined number is an integer greater than 1;

a corresponding plurality of driver dies/chips, wherein for each individual driver die/chip, an array of discrete pads and at least one common pad are formed on a top surface of the individual driver die/chip, and wherein the array of discrete pads are separated from each other, and wherein the at least one common pad is separated from each one of the array of discrete pads; and an interconnection structure, disposed between the LED matrix and the corresponding plurality of driver dies/chips, and configured to electrically couple each one of the plurality of sub LED matrix sections to a corresponding one driver die/chip in the corresponding plurality of driver dies/chips, the interconnection structure comprising at least one semiconductor layer having a plurality groups of through semiconductor vias formed in the at least one semiconductor layer.

17. The LED driving system of claim 16, wherein the interconnection structure further comprises at least one rewiring layer formed on the at least one semiconductor layer, and wherein the at least one rewiring layer comprises a plurality of lateral interposing layers configured to provide wiring and electrical conductive routes in a lateral direction and a plurality of vertical routing vias configured to provide wiring and electrical conductive routes in a vertical direction.

18. The LED driving system of claim 16, wherein the interconnection structure has a first surface with a first plurality of exposed pads or footprints formed on the first surface, and wherein a geometrical pattern of the first plurality of exposed pads or footprints is identical to a geometrical pattern of pads/connections/terminals on a top surface of the plurality of driver dies/chips.

19. The LED driving system of claim 18, wherein the interconnection structure further has a second surface opposite to the first surface with a second plurality of exposed pads or footprints formed on the second surface, and wherein a geometrical pattern of the second plurality of exposed conductive pads or footprints is identical to a geometrical pattern of pads/connections/terminals on a bottom surface of the LED matrix.

* * * * *